(12) United States Patent
Miyazaki (10) Patent No.: US 7,808,239 B2
(45) Date of Patent: Oct. 5, 2010

(54) MAGNETIC RESONANCE IMAGING APPARATUS AND METHOD FACILITATING PRE-PULSE SETTING

(75) Inventor: Mitsue Miyazaki, Mount Prospect, IL (US)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 46 days.

(21) Appl. No.: 12/081,635

(22) Filed: Apr. 18, 2008

(65) Prior Publication Data

US 2008/0265884 A1   Oct. 30, 2008

(30) Foreign Application Priority Data

Apr. 25, 2007   (JP) ............................. 2007-115012

(51) Int. Cl.
   *G01V 3/00* (2006.01)
(52) U.S. Cl. .................................................... 324/309
(58) Field of Classification Search ......... 324/300–322; 600/410–435
   See application file for complete search history.

(56) References Cited

U.S. PATENT DOCUMENTS

| | | | | |
|---|---|---|---|---|
| 5,270,653 | A * | 12/1993 | Pauly .......................... | 324/309 |
| 6,497,666 | B1 * | 12/2002 | Phillips et al. .............. | 600/458 |
| 6,564,080 | B1 * | 5/2003 | Kimura ....................... | 600/410 |
| 6,577,127 | B2 * | 6/2003 | Harvey et al. ............... | 324/307 |
| 6,747,757 | B1 * | 6/2004 | Enomoto ..................... | 358/1.9 |
| 6,760,611 | B1 * | 7/2004 | Watanabe .................... | 600/410 |
| 6,781,375 | B2 * | 8/2004 | Miyazaki et al. ............ | 324/314 |
| 7,298,146 | B1 * | 11/2007 | Maier .......................... | 324/318 |
| 7,587,233 | B2 * | 9/2009 | Wong et al. ................. | 600/419 |
| 2005/0025357 | A1 * | 2/2005 | Landwehr et al. .......... | 382/170 |
| 2007/0083105 | A1 * | 4/2007 | Miyazaki et al. ........... | 600/410 |
| 2007/0229070 | A1 | 10/2007 | Miyazaki | |

FOREIGN PATENT DOCUMENTS

JP   2003-144416   5/2003

OTHER PUBLICATIONS

U.S. Appl. No. 12/052,274, filed Mar. 20, 2008, Inventors: Kitane et al.

* cited by examiner

*Primary Examiner*—Brij B Shrivastav
*Assistant Examiner*—Dixomara Vargas
(74) *Attorney, Agent, or Firm*—Nixon & Vanderhye PC (57) ABSTRACT

A magnetic resonance imaging apparatus includes an imaging condition setting unit and an image acquisition unit. The imaging condition setting unit includes an input part for inputting an imaging condition with applying plural pre-pulses. The image acquisition unit performs imaging according to the imaging condition and generates an image based on data acquired by the imaging. The imaging condition setting unit includes a display part configured to display an application region and attribute information of at least one pre-pulse of the plural pre-pulses together with a position of the imaging.

22 Claims, 9 Drawing Sheets

MAGNETIC RESONANCE IMAGING APPARATUS AND METHOD FACILITATING PRE-PULSE SETTING

BACKGROUND OF THE INVENTION

1. Field of the Invention

The present invention relates to an MRI (magnetic resonance imaging) apparatus and a magnetic resonance imaging method which excites nuclear spin of an object magnetically with an RF (radio frequency) signal having the Larmor frequency and reconstructs an image based on an NMR (nuclear magnetic resonance) signal generated due to the excitation, and more particularly, to a magnetic resonance imaging apparatus and a magnetic resonance imaging method which allows an operator to set an imaging condition for applying a single or plural pre-pulses easily.

2. Description of the Related Art

MRI is an imaging method which excites nuclear spin of an object set in a static magnetic field with an RF signal having the Larmor frequency magnetically and reconstructs an image based on an NMR signal generated due to the excitation. That is, echo signals with regard to spins included in an imaging region of an object are acquired and an MRI image is generated based on the acquired echo signals.

In an ordinary MRI, plural pre-pulses are applied prior to an application of an excitation pulse for acquisition of an NMR signal. Types of pre-pulses include a SORS (slice-selective off-resonance sinc pulse), a presat (presaturation) pulse, a t-SLIP (time-Spatial Labeling Inversion Pulse), a MTC (magnetization transfer contrast) pulse and so on. For example, in the t-SLIP method, a tagging inversion pulse is applied with a slice selective excitation gradient magnetic field pulse subsequently to inversion of a spin in an imaging region by an inversion pulse. Consequently, the spin of a tag region selected regionally is inverted and tagged (see, for example, Japanese Patent Application (Laid-Open) No. 2001-252263). A presat pulse is applied for suppressing a flow artifact, vein signals or effects of motion and vibration, there is the case that a presat pulse is applied plural times.

Therefore, when an imaging condition is set, an operator needs to set a type and an order of one or more pre-pulses to be applied in addition to an imaging selection.

Figure 1:
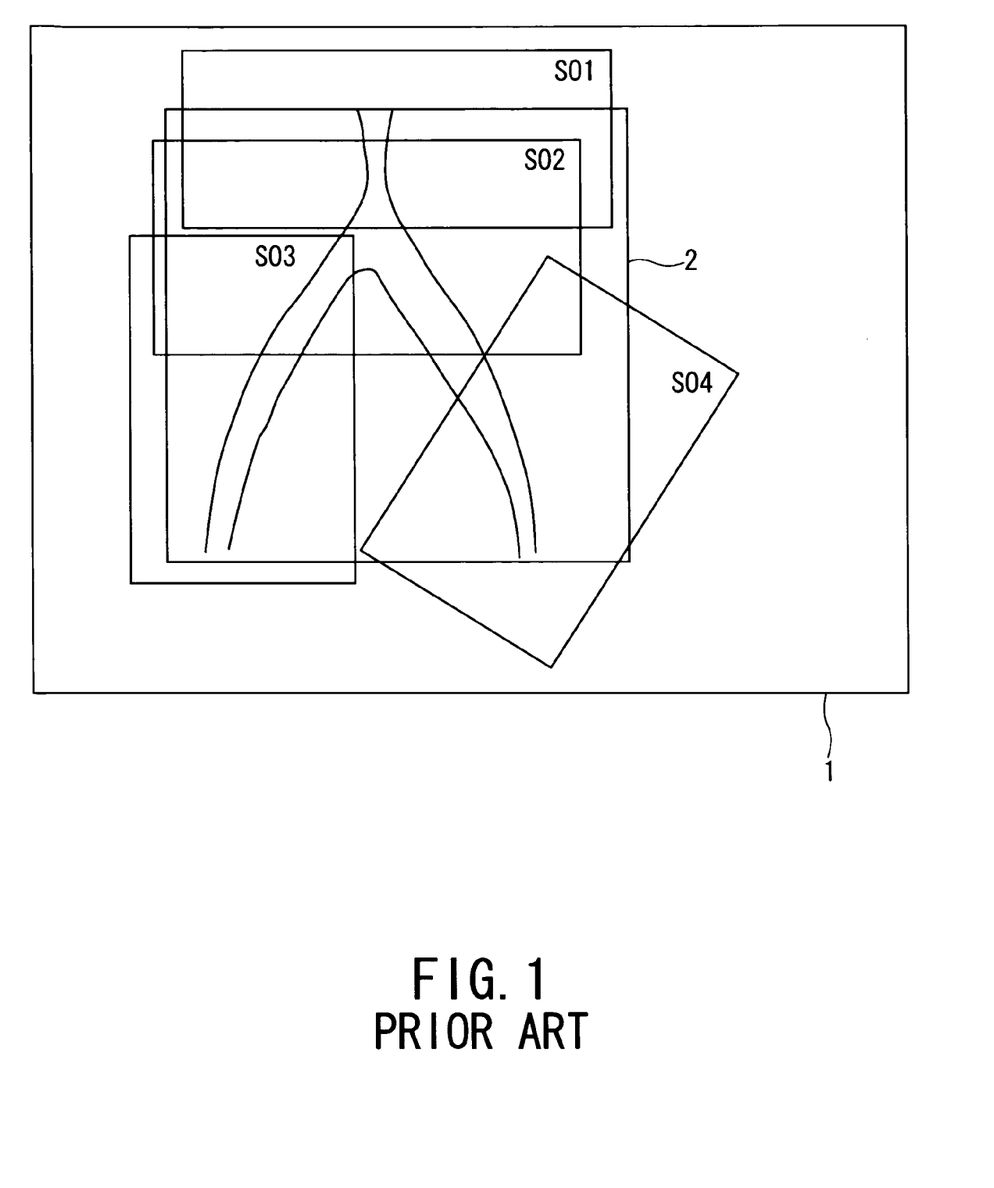
FIG. 1 is a diagram showing an example of conventional screen for setting a pre-pulse.

FIG. 1 is a diagram showing an example of conventional screen for setting a pre-pulse.

As shown in FIG. 1, a section is set every pre-pulse since there is the case that a section excited by a pre-pulse is set separately from an imaging section. That is, a LOCATOR IMAGE 2 for setting an excitation section is displayed on a monitor 1. Then, a slice SO2 excited as an imaging section is set. A slice SO1 excited by an ASL (Arterial spin labeling) PULSE which is a pre-pulse for tagging a blood flow flowing into the imaging section is set. In addition, slices SO3 and SO4 excited by two pre-pulses (SATBAND PULSE 1, SATBAND PULSE 2) for signal suppression are set.

Further, when water selective excitation pulse or a fat saturation pulse is applied as a pre-pulse, water excitation or fat saturation is performed by matching a center frequency of the pre-pulse a resonant frequency of signals from a water region such as blood (water signals) or signals from a fat region (fat signals).

However, on a conventional screen for setting a pre-pulse, a slice excited by each pre-pulse is displayed only as just a box as shown in FIG. 1. Therefore, it may be hard for an operator to see the relation between a pre-pulse and a slice. That is, it is hard for an operator to see at which slice position and in which order each pre-pulse is applied easily. Specifically, when a presat pulse and a t-SLIP are applied or when plural presat pulses are applied, to see time-series information is hard.

Further, when a water selective excitation pulse or a fat saturation pulse is applied as a pre-pulse, it is necessary to match a center frequency of the pre-pulse with a resonant frequency of water signals or fat signals. However, there is a problem in that it becomes difficult for an operator to set the center frequency of the water selective excitation pulse or the fat saturation pulse since a peak of the water signals or the fat signals on a frequency spectrum spreads depending on a part to be imaged in an object or a shape of an imaging target.

For this reason, it is preferable to create an interface with improved operability so that an operator can set single or plural pre-pulses for various objects such as water excitation or fat saturation easily.

SUMMARY OF THE INVENTION

The present invention has been made in light of the conventional situations, and it is an object of the present invention to provide a magnetic resonance imaging apparatus and a magnetic resonance imaging method which allow an operator to easily set an imaging condition with applying a single or plural pre-pulses for a desired object or desired objects such as water excitation or fat saturation.

The present invention provides a magnetic resonance imaging apparatus comprising: an imaging condition setting unit including an input part for inputting an imaging condition with applying plural pre-pulses; and an image acquisition unit configured to perform imaging according to the imaging condition and generate an image based on data acquired by the imaging, wherein said imaging condition setting unit includes a display part configured to display an application region and attribute information of at least one pre-pulse of the plural pre-pulses together with a position of the imaging, in an aspect to achieve the object.

The present invention also provides a magnetic resonance imaging apparatus comprising: a frequency spectrum acquisition unit configured to acquire a frequency spectrum of magnetic resonance signals from an object; an imaging condition setting unit including an input part for inputting an imaging condition with applying a pre-pulse and a display part configured to display information representing a center frequency of signals from a desired matter and a band of the pre-pulse together with the frequency spectrum; and an image acquisition unit configured to perform imaging according to the imaging condition and generate an image based on data acquired by the imaging, in an aspect to achieve the object.

The present invention also provides a magnetic resonance imaging apparatus comprising: an imaging condition setting unit configured to set an imaging condition with applying plural pre-pulses; and an image acquisition unit configured to perform imaging according to the imaging condition and generate an image based on data acquired by the imaging, wherein said imaging condition setting unit includes: an input part for inputting at least one of application regions and attribute information of the plural pre-pulses; a display part configured to display at least one of the application regions and the attribute information of the plural pre-pulses; and a determining part configured to determine an application order of the plural pre-pulses based on the attribute information inputted with the input part, in an aspect to achieve the object.

The present invention also provides a magnetic resonance imaging apparatus for generating a MRI image based on an echo signal with regard to spins included in an imaging region on an object comprising: an imaging condition setting unit for setting an imaging condition for tagging blood flowing into the imaging region; an imaging unit configured to apply an inversion pulse for exciting the imaging region selectively, a tagging pulse for inverting spins included in a tagged region of the imaging region following the inversion pulse and a saturation pulse for saturating spins of blood flowing into a part region in the imaging region according to the imaging condition to acquire the echo signal after a constant period from applying the tagging pulse; a generating unit configured to generate a blood vessel image of the imaging region based on the echo signal; and a display unit configured to display the imaging region, an application region of the tagging pulse and an application region of the saturation pulse together with at least one of a name of the application region of the tagging pulse, a name of the application region of the saturation pulse, an application purpose of the tagging pulse, an application purpose of the saturation pulse, an application order of the tagging pulse and an application order of the saturation pulse to assist setting the imaging condition, in an aspect to achieve the object.

The present invention also provides a magnetic resonance imaging method comprising: inputting an imaging condition with applying plural pre-pulses; and performing imaging according to the imaging condition and generating an image based on data acquired by the imaging, wherein an application region and attribute information of at least one pre-pulse of the plural pre-pulses together with a position of the imaging are displayed, in an aspect to achieve the object.

The magnetic resonance imaging apparatus and the magnetic resonance imaging method as described above allow an operator to easily set an imaging condition with applying a single or plural pre-pulses for a desired object or desired objects such as water excitation or fat saturation.

DESCRIPTION OF THE PREFERRED EMBODIMENTS

A magnetic resonance imaging apparatus and a magnetic resonance imaging method according to embodiments of the present invention will be described with reference to the accompanying drawings.

Figure 2:
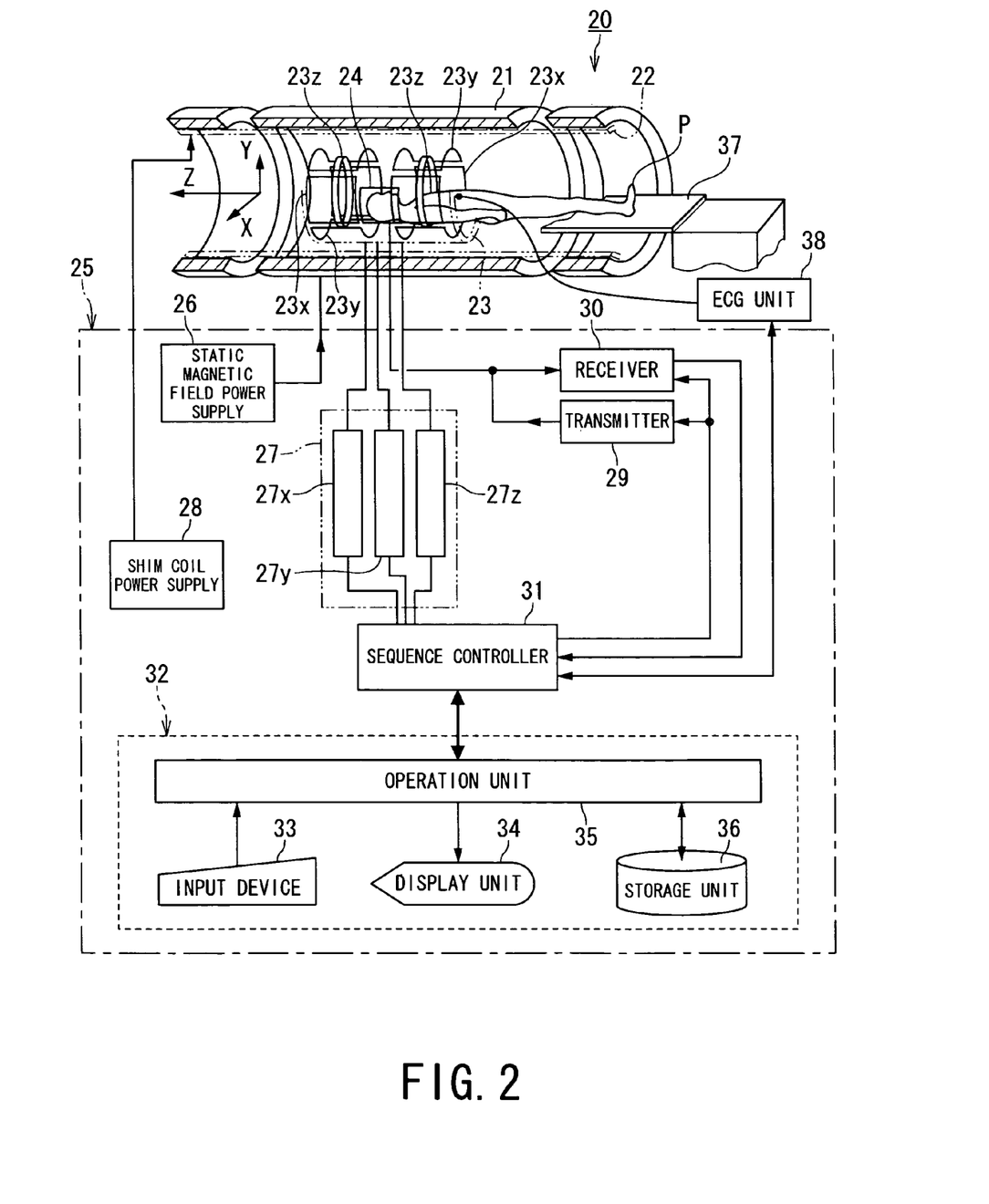
FIG. 2 is a block diagram showing a magnetic resonance imaging apparatus according to an embodiment of the present invention.

FIG. 2 is a block diagram showing a magnetic resonance imaging apparatus according to an embodiment of the present invention.

A magnetic resonance imaging apparatus 20 includes a static field magnet 21 for generating a static magnetic field, a shim coil 22 arranged inside the static field magnet 21 which is cylinder-shaped, a gradient coil 23 and a RF coil 24. The static field magnet 21, the shim coil 22, the gradient coil 23 and the RF coil 24 are built in a gantry (not shown).

The magnetic resonance imaging apparatus 20 also includes a control system 25. The control system 25 includes a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, a Y-axis gradient power supply 27y and a Z-axis gradient power supply 27z. The computer 32 includes an input device 33, a display unit 34, a operation unit 35 and a storage unit 36.

The static field magnet 21 communicates with the static magnetic field power supply 26. The static magnetic field power supply 26 supplies electric current to the static field magnet 21 to get the function to generate a static magnetic field in a imaging region. The static field magnet 21 includes a superconductivity coil in many cases. The static field magnet 21 gets current from the static magnetic field power supply 26 which communicates with the static field magnet 21 at excitation. However, once excitation has been made, the static field magnet 21 is usually isolated from the static magnetic field power supply 26. The static field magnet 21 may include a permanent magnet which makes the static magnetic field power supply 26 unnecessary.

The static field magnet 21 has the cylinder-shaped shim coil 22 coaxially inside itself. The shim coil 22 communicates with the shim coil power supply 28. The shim coil power supply 28 supplies current to the shim coil 22 so that the static magnetic field becomes uniform.

The gradient coil 23 includes an X-axis gradient coil 23x, a Y-axis gradient coil 23y and a Z-axis gradient coil 23z. Each of the X-axis gradient coil 23x, the Y-axis gradient coil 23y and the Z-axis gradient coil 23z which is cylinder-shaped is arranged inside the static field magnet 21. The gradient coil 23 has also a bed 37 in the area formed inside it which is an imaging area. The bed 37 supports an object P. Around the bed 37 or the object P, the RF coil 24 may be arranged instead of being built in the gantry.

The gradient coil 23 communicates with the gradient power supply 27. The X-axis gradient coil 23x, the Y-axis gradient coil 23y and the Z-axis gradient coil 23z of the gradient coil 23 communicate with the X-axis gradient power supply 27x, the Y-axis gradient power supply 27y and the Z-axis gradient power supply 27z of the gradient power supply 27 respectively.

The X-axis gradient power supply 27x, the Y-axis gradient power supply 27y and the Z-axis gradient power supply 27z supply currents to the X-axis gradient coil 23x, the Y-axis gradient coil 23y and the Z-axis gradient coil 23z respectively so as to generate gradient magnetic fields Gx, Gy and Gz in the X, Y and Z directions in the imaging area.

The RF coil 24 communicates with the transmitter 29 and the receiver 30. The RF coil 24 has a function to transmit a RF signal given from the transmitter 29 to the object P and receive a NMR signal generated due to an nuclear spin inside the object P which is excited by the RF signal to give to the receiver 30.

The sequence controller 31 of the control system 25 communicates with the gradient power supply 27, the transmitter 29 and the receiver 30. The sequence controller 31 has a function to storage sequence information describing control information needed in order to make the gradient power supply 27, the transmitter 29 and the receiver 30 drive and generate gradient magnetic fields Gx, Gy and Gz in the X, Y and Z directions and a RF signal by driving the gradient power supply 27, the transmitter 29 and the receiver 30 according to a predetermined sequence stored. The control information above-described includes motion control information, such as intensity, impression period and impression timing of the pulse electric current which should be impressed to the gradient power supply 27

The sequence controller 31 is also configured to give raw data to the computer 32. The raw data is complex data obtained through the detection of a NMR signal and A/D conversion to the NMR signal detected in the receiver 30.

The transmitter 29 has a function to give a RF signal to the RF coil 24 in accordance with control information provided from the sequence controller 31. The receiver 30 has a function to generate raw data which is digitized complex number data by detecting a NMR signal given from the RF coil 24 and performing predetermined signal processing and A/D converting to the NMR signal detected. The receiver 30 also has a function to give the generated raw data to the sequence controller 31.

In addition, an ECG unit 38 for acquiring an ECG (electrocardiogram) signal of the object P is provided with the magnetic resonance imaging apparatus 20. The ECG signal detected by the ECG unit 38 is outputted to the computer 32 through the sequence controller 31.

The computer 32 gets various functions by the operation unit 35 executing some programs stored in the storage unit 36 of the computer 32. The computer 32 may include some specific circuits instead of using some of the programs.

Figure 3:
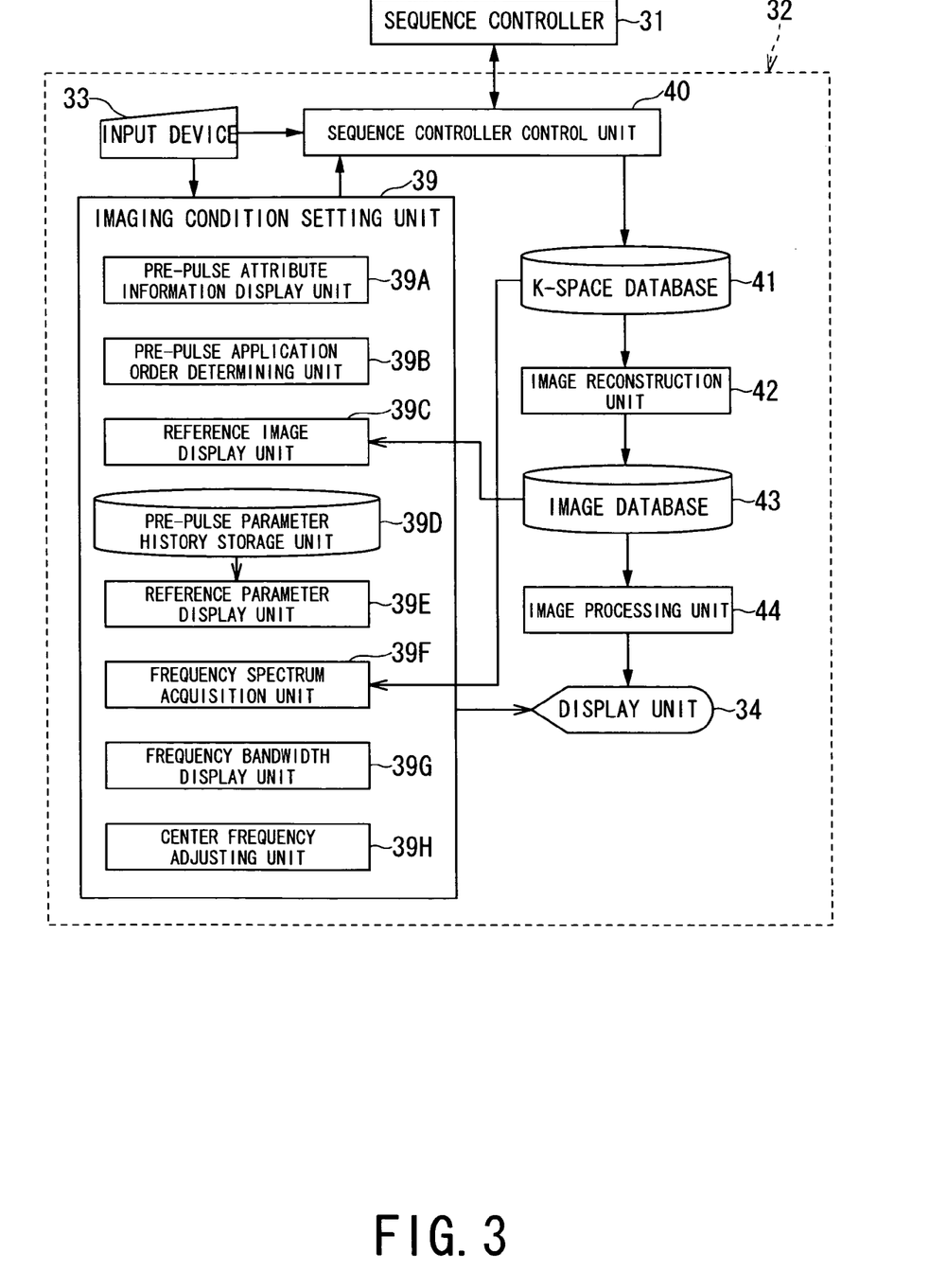
FIG. 3 is a functional block diagram of the computer shown in FIG. 2.

FIG. 3 is a functional block diagram of the computer 32 shown in FIG. 2.

The computer 32 functions as an imaging condition setting unit 39, a sequence controller control unit 40, a k-space database 41, an image reconstruction unit 42, an image database 43 and an image processing unit 44 by program.

The imaging condition setting unit 39 has a function to set an imaging condition including a pulse sequence based on information from the input device 33 displaying a screen for setting an imaging condition on the display unit 34 and to provide the set imaging condition to the sequence controller control unit 40.

Specifically, the imaging condition setting unit 39 has a function to set a pulse sequence with application of single pre-pulse or plural pre-pulses. Therefore, the function to set a name (type) of pre-pulse to be applied and an excitation section (slice) and an excitation region by a pre-pulse as well as an imaging section (slice) is provided with the imaging condition setting unit 39. For this reason, a scout image and/or a reference image for referring when an application region or an application position of a pre-pulse is set can be displayed on a setting screen for an imaging condition. A scout image may be an image for determining a position such as an axial section image, a coronal section image, and a sagittal section image. Note that, the image, by which it is possible to compare dynamics, except a scout image can be displayed as a reference image for setting an application region and/or an application position of a pre-pulse. For example, when a blood vessel image is imaged, a non-contrast-enhanced blood vessel image can be used as a reference image. A non-contrast-enhanced blood vessel image for reference can be acquired by a FBI (Fresh Blood Imaging) method, a TOF (time of flight) method or a 3D (three dimensional) steady state free precession (SSFP) method without a spin labeling pulse.

The FBI method is a non-contrast-enhanced MRA (magnetic resonance angiography) to acquire echo data every plural cardiac beats repeatedly with delaying by a predetermined time from a trigger signal synchronized with a reference wave to show a cardiac time phase of the object P, such as an R wave. In the FBI method, transverse relaxation (T2) component of the magnetization of a blood flow is recovered by passing plural cardiac beats, and consequently a water (blood) weighted image in which T2 magnetization component of a blood is enhanced can be obtained as a blood vessel image. Furthermore, in the FBI method, a three-dimensional scan to acquire echo data (volume data) equivalent to a pre-determined slice encode amount is performed.

The TOF method is a method for obtaining a blood vessel image with using inflow effect to an image section with regard to a blood. That is, the TOF method is a method for imaging blood signals flowing into an imaging section subsequently to an application of a saturation pulse. In the TOF method, a scan is performed at earlier data acquisition timing with a FE (field echo) type sequence and a longitudinal relaxation (T1) weighted image is obtained as a blood vessel image.

Then, an application region of a pre-pulse such as a t-SLIP used for imaging of a non-contrast-enhanced blood vessel image can be set by using a non-contrast-enhanced blood vessel image obtained with the FBI method, the TOF method or the three-dimensional SSFP method as a reference image.

Further, attribute information such as a name of a pre-pulse under setting or set pre-pulse can be displayed together with an application region on a screen for setting an imaging condition in order to set a condition of each pre-pulse easily.

There is information such as a name (type), an application purpose and effect, and an application order of a pre-pulse in addition to position information and direction information of a section (slice) excited by a pre-pulse as attribute information of a pre-pulse. The attribute information such as a name (type), an application purpose and effect, and an application order of a pre-pulse can be displayed within or near a frame showing an excited slice position. The attribute information of a pre-pulse to be displayed and the corresponding frame showing a slice position can be displayed in a different display form for every pre-pulse. For example, the color and/or the line type of the attribute information of a pre-pulse to be displayed and the corresponding frame showing a slice position can be different color and/or line type so as to be identifiable every pre-pulse. In addition, the information with regard to an application target such as an object to be an application target of a pre-pulse and a direction of a fetus in an object can be also displayed on the display unit 34.

On the other hands, there are a selective excitation pulse such as a water selective excitation pulse, a suppression pulse such as a fat saturation pulse and a silicone suppression pulse, a spin labeling (also referred to tagging or labeling) pulse such as a SORS, a t-SLIP and an ASL pulse, a MTC pulse and a (pre) saturation (presat) pulse as a name (type) of a pre-pulse. The water selective excitation pulse is a pre-pulse to excite water selectively and the fat saturation pulse is a pre-pulse to suppress a fat. Some selective excitation pulses and suppression pulses such as a water selective excitation pulse and a fat saturation pulse use chemical shift that a resonant frequency is different from that of another matter.

The spin labeling pulse is a pre-pulse for tagging a moving object such as blood and cerebrospinal fluid (CSF) flowing into an imaging section. Especially, a spin labeling pulse for labeling spins of blood is called an ASL pulse. There is a t-SLIP with application of plural pulses for labeling as one of spin labeling pulses.

A t-SLIP is configured with a region non-selective inversion pulse and a region selective inversion pulse. A region non-selective inversion pulse can be witched into ON/OFF state. That is, a t-SLIP includes at least a region selective inversion pulse, and is configured with only a region selective inversion pulse, or alternatively, with both of a region selective inversion pulse and a region non-selective inversion pulse.

A region selective inversion pulse can be set arbitrarily independent of an imaging section. When blood flowing into an imaging region is labeled with a region selective inversion pulse, signal intensity at the part to which the blood reaches after an inversion time (TI) becomes high. Note that, when a region non-selective inversion pulse is set to OFF, signal intensity at the part to which the blood reaches after a TI becomes low. Therefore, a moving direction and a distance of blood can be recognized. That is, signal intensity of only blood which reaches to an imaging section after a TI can be enhanced or suppressed selectively. Note that, a t-SLIP is applied after passing by a certain delay time from an R wave of an ECG signal and an imaging is performed in synchronized with an ECG, as needed.

A presat pulse is a pre-pulse for suppressing signals from a desired matter by saturating spins of the desired matter. A presat pulse is applied before an application of a dephasing gradient magnetic field. A MTC pulse is a pre-pulse for saturating a magnetization of absorbed water protons by using MTC effect to suppress signals from a parenchymatous organ. A SORS is a MTC pulse applied with a slice selective gradient magnetic field.

A purpose and effect of a presat pulse is e.g., suppression of a vein, flow artifact suppression, suppression of intestinal motion, and vibration suppression. Note that, a purpose and/or effect of a pre-pulse, of which purpose and/or effect is specified, except a presat pulse may be displayed on the display unit 34 for reference. When plural pre-pulses, especially, plural presat pulses are applied, an application order can be displayed. Attribute information of presat pulses can be displayed in time series by expressing an application order in numbers, for example, like as presat 1, presat 2, presat 3, . . . .

A practical example of application of plural pre-pulses is that an inversion pulse for exciting an imaging region is applied selectively and a labeling pulse for inverting spins included in a labeling region within the imaging region is applied just after the inversion pulse. In addition, a saturation pulse for saturating spins of blood flowing into a part of the imaging region is applied, and an echo signal is acquired after a certain time from application of the labeling pulse. In this case, displaying at least one of a name of the application region of the labeling pulse, a name of the application region of the saturation pulse, the application purpose of the labeling pulse, the application purpose of the saturation pulse, and the application order of the labeling pulse and the application order of the saturation pulse together with the imaging region, the application region by the labeling pulse and the application region by the saturation pulse on the screen for setting an imaging condition leads to support of setting the imaging condition.

In addition, for support of setting a condition of each pre-pulse, a parallel display or a superimposed display of parameters of a pre-pulse, set when an imaging was performed in history, on the screen for setting an imaging condition is possible. Past parameters of a pre-pulse can be also displayed on another screen for setting an imaging condition. That is, if parameters for determining a pre-pulse having been used for acquiring an image having been acquired in history are displayed on the screen for setting an imaging condition as reference values or default values, a user can determine parameters of a pre-pulse to be set easily by referring the parameters of the pre-pulse having been used in history.

There is a parameter such as a TI and a BBTI (black blood TI) in addition to attribute information of a pre-pulse, as a parameter of a pre-pulse. A BBTI is an application interval between a region non-selective inversion pulse of a t-SLIP and an imaging pulse. In the case that a pre-pulse is a spin labeling pulse, a tagging position can be also a parameter.

A pre-pulse attribute information display unit 39A, a pre-pulse application order determining unit 39B, a reference image display unit 39C, a pre-pulse parameter history storage unit 39D and a reference parameter display unit 39E are provided with the imaging condition setting unit 39 to have display functions of attribute information and an application order of a pre-pulse as described above.

The pre-pulse attribute information display unit 39A has a function to display attribute information of a pre-pulse, having slice selectivity, under setting or set based on information from the input device 33 on the display unit 34.

The pre-pulse application order determining unit 39B has a function to set an application order of a pre-pulse, having slice selectivity, under setting or set based on information from the input device 33 and/or attribute information of a pre-pulse. An application order of a pre-pulse can be set as a value from the input device 33. Alternatively, an application order can be configured to be set automatically by selecting attribute information of a pre-pulse or a frame showing a slice position displayed on the display unit 34 with the input device 33 such as a mouse. For example, an application order of a pre-pulse can be also determined so that a desired pre-pulse out of plural pre-pulses is applied just before a 90-degree excitation pulse for imaging. Specifically, in the case of applying plural presat pulses, the signal suppression effect by a presat pulse applied just before a 90-degree excitation pulse for data acquisition, that is, lastly is more extensive than that by a presat pulse applied before then. Then, the function to set automatically an application order of a presat pulse having an application purpose desiring more satisfactory signal suppression effect just before the 90-degree excitation pulse may be provided with the pre-pulse application order determining unit 39B. An example of an application purpose desiring satisfactory signal suppression effect is suppression of vein signals.

The reference image display unit 39C has a function to obtain a scout image and/or a reference image for referring when an application region and/or an application position of a pre-pulse are set from the image database 43 and to display the obtained scout image and/or the obtained reference image on a screen for setting an imaging condition displayed on the display unit 34.

The pre-pulse parameter history storage unit 39D stores parameters, of a pre-pulse having been used for acquiring an image having been acquired in history, connected with an image and/or an imaging part.

The reference parameter display unit 39E has a function to obtain parameters of a pre-pulse related to a past image having acquired by using a pre-pulse identical to or related to a pre-pulse to be set and/or parameters of a pre-pulse having been used when a past image at an imaging part identical to or related to that for an image to be acquired was acquired from the pre-pulse parameter history storage unit 39D and to display them on the display unit 34.

Figure 4:
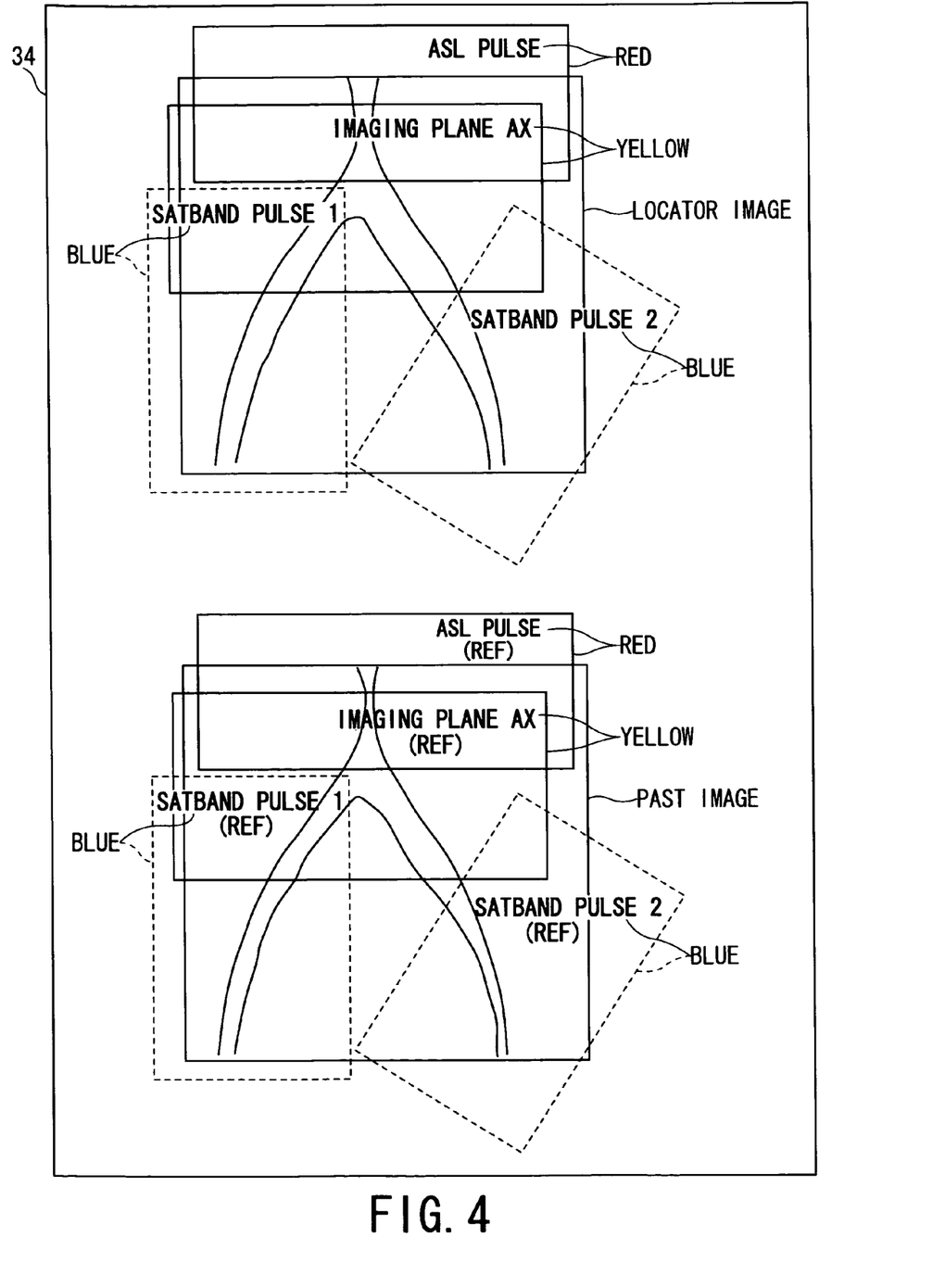
FIG. 4 is a diagram showing an example of screen for setting a pre-pulse displayed on the display unit by the imaging condition setting unit shown in FIG. 3.

FIG. 4 is a diagram showing an example of screen for setting a pre-pulse displayed on the display unit 34 by the imaging condition setting unit 39 shown in FIG. 3.

As shown in FIG. 4, a LOCATOR IMAGE is displayed as a reference image in order to set a pre-pulse and its exciting position on the display unit 34. Then, a frame showing a slice position excited as an imaging section is displayed. Attribute information "IMAGING PLANE AX" of a slice is displayed in the frame showing the imaging section. For example, both the letters of "IMAGING PLANE AX" and the frame showing the imaging section are colored yellow. Therefore, an operator can be recognized the frame displayed by yellow is the imaging section easily. Thus, as well as an excitation section of a pre-pulse, an imaging section can be displayed on the display unit 34 identifiably.

Further, a red frame is also displayed and the letters of "ASL PULSE" are displayed in red within the frame. Therefore, it is recognized easily that the region shown by the red frame is excited by an ASL PULSE for tagging blood flow flowing into the imaging section shown by the yellow frame.

Furthermore, two blue dotted frames are displayed, the letters of "SATBAND PULSE 1" are displayed in blue within one frame and the letters of "SATBAND PULSE 2" are displayed in blue within the other frame. Therefore, it can be recognized easily that signals in the regions within the two frame displayed in blue are suppressed respectively by application of presat pulses. In addition, it can be also recognized easily that the presat pulse shown by "SATBAND PULSE 1" is applied firstly and the presat pulse shown by "SATBAND PULSE 2" is applied secondly.

In addition, each type and each application region of pre-pulses having been used when a past image at an imaging part identical to or near that for the LOCATOR IMAGE was acquired can be also displayed in parallel for reference, as needed. Therefore, for example, an operator can set easily a same pre-pulse as a pre-pulse having been used when an image having been acquired in history was acquired.

Figure 5:
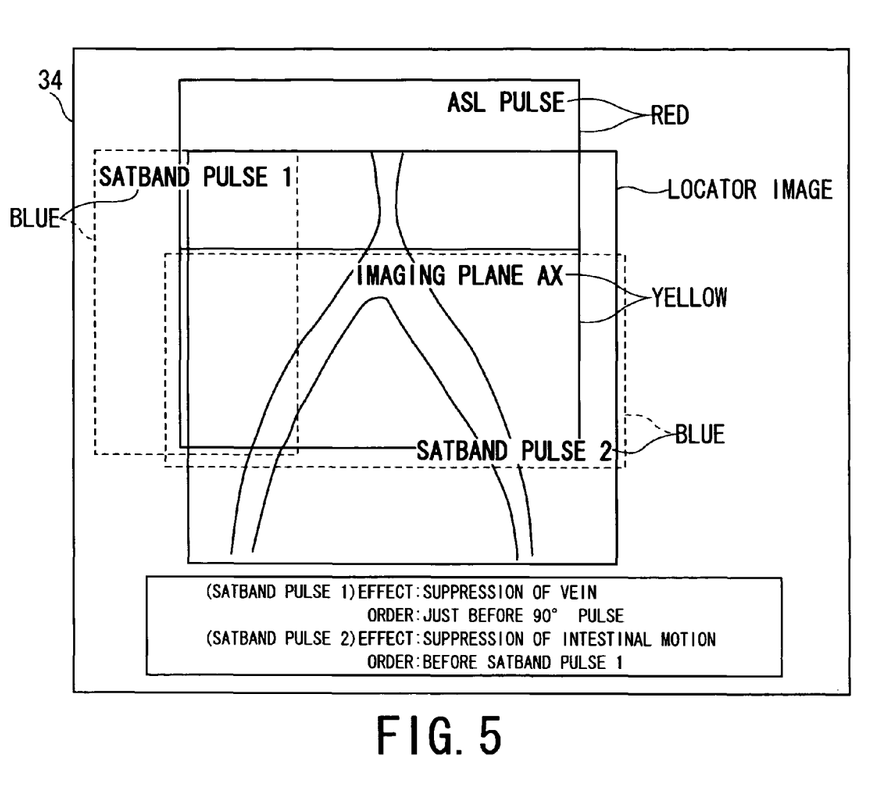
FIG. 5 is a diagram showing another example of screen for setting a pre-pulse displayed on the display unit by the imaging condition setting unit shown in FIG. 3.

FIG. 5 is a diagram showing another example of screen for setting a pre-pulse displayed on the display unit 34 by the imaging condition setting unit 39 shown in FIG. 3.

As shown in FIG. 5, a pre-pulse and a LOCATOR IMAGE for setting its excitation position are displayed on the display unit 34. A frame showing a slice position excited as an imaging section is displayed in yellow. Further, attribute information "IMAGING PLANE AX" of a slice is displayed in yellow within the frame showing the imaging section.

In addition, a red frame is displayed and the letters of "ASL PULSE" is displayed in red within the frame. Therefore, it is recognized easily that an ASL PULSE excites and tags spins included in the region shown by the red frame.

Furthermore, two blue dotted frames are displayed, the letters of "SATBAND PULSE 1" are displayed in blue within one frame and the letters of "SATBAND PULSE 2" are displayed in blue within the other frame. Therefore, it can be recognized easily that signals in the regions within the two frames displayed in blue are suppressed respectively by application of presat pulses.

In addition, application purposes and application orders of the respective presat pulses are displayed at an arbitrary position of a screen for setting pre-pulse, in the example shown in FIG. 5, at an underpart of the LOCATOR IMAGE. An application purpose can be selected from the items set in advance by operating the input device 33 such as a mouse. In the example shown in FIG. 5, the application purpose of the presat pulse shown by "SATBAND PULSE1" is set to suppression of vein signals, and the application purpose of the presat pulse shown by "SATBAND PULSE 2" is set to suppression of influence due to intestinal motion.

Here, more satisfactory signal suppression effect is required in suppression of vein signals than in suppression of influence due to intestinal motion. Further, it is known that signal suppression effect by a presat pulse applied just before a 90-degree excitation pulse for data acquisition is more extensive. Therefore, when the application purpose of the presat pulse shown by "SATBAND PULSE 1" is set to suppression of vein signals, the pre-pulse application order determining unit 39B sets automatically the application order of the presat pulse shown by "SATBAND PULSE 1" just before a 90-degree excitation pulse so that the vein signals are suppressed more satisfactory. On the contrary, the pre-pulse application order determining unit 39B sets the application order of the presat pulse shown by "SATBAND PULSE 2" before application of the presat pulse shown by "SATBAND PULSE 1". Consequently, the screen for setting pre-pulse displays the application orders of the presat pulse shown by SATBAND PULSE 1 and the presat pulse shown by "SATBAND PULSE 2" as just before a 90-degree excitation pulse and before application of the presat pulse shown by "SATBAND PULSE 1" respectively.

That is, in the example shown in FIG. 4, the application orders of the presat pulses are displayed with the numbers, in the example shown in FIG. 5, the numbers are used for only identification of the presat pulses and the application orders are displayed separately. Thus, it is possible to display attribute information of a pre-pulse by a desired displaying method to help operator's understanding and also to set or change application orders of pre-pulses by using displayed attribute information.

Figure 6:
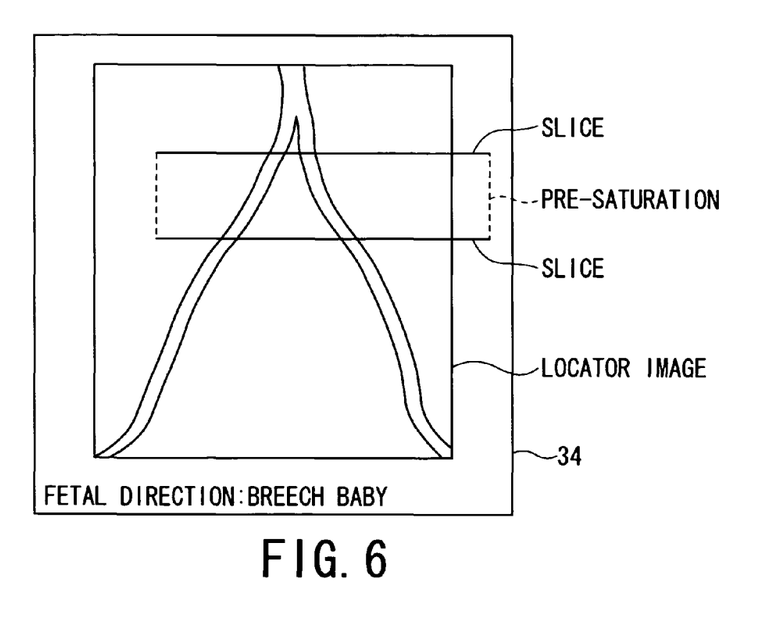
FIG. 6 is a diagram showing an example of displaying a direction for applying a presat pulse and a fetal direction on the display unit by the imaging condition setting unit shown in FIG. 3.

FIG. 6 is a diagram showing an example of displaying a direction for applying a presat pulse and a fetal direction on the display unit 34 by the imaging condition setting unit 39 shown in FIG. 3.

An application region including plural slices to be application targets of a presat pulse is shown as a rectangle on a two-dimensional LOCATOR IMAGE. However, when the number of slices to be application targets of a presat pulse increases, there is a case that an application region of a presat pulse becomes in approximate square shape. In this case, there is possibility that an operator mistakes a direction normal to a slice as a direction parallel to a slice. Then, as shown in FIG. 6, an application region of a presat pulse can be displayed by using plural line types for showing a slice direction of an application region of a presat pulse (a direction normal to a slice) and a direction parallel to a slice expressly. In the example shown in FIG. 6, while a direction parallel to a slice is displayed by solid line, a direction normal to a slice is displayed by dotted line. This allows an operator to see an application direction of a presat pulse easily. Note that, a slice direction of an application region of a presat pulse and/or a direction parallel to a slice may be displayed with using letters or symbols directly.

The imaging condition setting unit 39 can also display a fetal direction as application target information of a presat pulse on the display unit 34. An object direction is proved since body position of an object is normally prone position or supine position. Therefore, an operator can see an object direction easily by displaying a body position with H (HEAD), F (FEET), L (LEFT) and R (RIGHT). However, since a fetus may be a breech baby, there is a possibility that the direction judgment in a LR direction and a HF direction becomes hard. Then, displaying a fetal direction can help operator's understanding. A fetal direction can be displayed relatively, for example, like a fatal direction is a same direction or an opposite direction (that is, a breech baby) to the direction of an object which is a mother body or a fatal direction can be also displayed absolutely like a fatal direction is a same direction or an opposite direction to the normal direction of an object. In FIG. 6, the example of a fetal direction displayed as a breech baby is shown. A fetal direction can be also displayed with the letters such as HF and LR.

Furthermore, in addition to the function described above, the imaging condition setting unit 39 has a function to set the center frequency of a suppression pulse or a selective excitation pulse to suppress or excite selectively signals from a desired matter such as fat signals, water signals, or silicone signals frequency-selectively with using chemical shift of a resonant frequency when the suppression pulse or the selective excitation pulse is applied as a pre-pulse.

A water selective excitation pulse is used in the case of imaging by WET (water excitation technique), PASTA (polarity altered spectral-selective acquisition) method or the like. The PASTA method is an imaging method for obtaining a water weighted image by a selective excitation of water signals with a binominal pulse. For this reason, an image in which fat signals are relatively suppressed by imaging with PASTA method can be obtained. Consequently, water selective excitation is also included in broad fat saturation. Note that, PASTASi is an imaging method for exciting silicone signals selectively by a principle similar to that in PASTA method.

When a selective excitation pulse and/or a suppression pulse are used, it is necessary to set a frequency of signals to be excited selectively and/or suppressed, that is, a central frequency of a pulse. When a selective excitation pulse and/or a suppression pulse are used, a frequency spectrum of magnetic resonance signals is obtained in advance for determining a center frequency of a selective excitation pulse and/or a suppression pulse.

A frequency spectrum can be acquired by a scan for acquisition of a frequency spectrum or another arbitrary method. Then, a center frequency of a selective excitation pulse and/or a suppression pulse is adjusted based on the obtained frequency spectrum so that the center frequency is matched with a resonant frequency of a desired matter such as water, fat or silicone. Normally, a shimming for adjusting uniformity of intensity of a static magnetic field is performed precedently to or after obtainment of a frequency spectrum so that the peak of the frequency spectrum becomes clear.

Therefore, the imaging condition setting unit 39 is configured to display a screen for setting a center frequency of a selective excitation pulse and/or a suppression pulse on the display unit 34 and to set a center frequencies of a selective excitation pulse and/or a suppression pulse based on information from the input device 33. A frequency spectrum is displayed on a screen for setting a center frequency. Furthermore, information showing a center frequency of signals from a desired matter, a center frequency of a selective excitation pulse and/or a suppression pulse, and a frequency band can be displayed on the frequency spectrum to support setting of the center frequency of the selective excitation pulse and/or the suppression pulse. Specifically, FWHM (Full Width at Half Max) of pulse application intensity can be displayed as a frequency band of a selective excitation pulse and/or a suppression pulse. An application purpose of a pre-pulse such as water excitation or a fat saturation may be displayed.

Therefore, for example, when a fat saturation is performed, an operator can recognize easily relative positional relationships among a resonant frequency of water signals, a center frequency of a fat saturation pulse and a frequency band in which effect of a fat saturation can be obtained by visibility. For example, since the difference in a resonant frequency between water signals and fat signals is −3.5 ppm, displaying a frequency distance of −3.5 ppm on a frequency spectrum also leads to support setting of a center frequency of a selective excitation pulse and/or a suppression pulse.

Here, the imaging condition setting unit 39 can be configured to update both of information such as a line showing a center frequency of signals and information such as a line showing a frequency band of a selective excitation pulse or a suppression pulse according to information for shifting either of the information such as a line showing the center frequency of the signals or the information such as a line showing the frequency band of the selective excitation pulse or the suppression pulse and to display them on the display unit 34 when the information for shifting is inputted to the imaging condition setting unit 39 from the input device 33.

Then, it is possible for an operator to adjust a center frequency of a water selective excitation pulse or a fat saturation pulse easily by moving a line showing a resonant frequency or a line showing a frequency band or the center frequency of the pulse with operation of the input device 33 such as a mouse so that water signals or fat signals having an expanded frequency band is within range of a FWHM of the water selective excitation pulse or the fat saturation pulse. Therefore, water selective excitation effect, silicone selective excitation effect or fat saturation effect can be improved. Note that, frequencies of a water selective excitation pulse and/or a fat saturation pulse can be also adjusted automatically by a threshold processing and/or an automatically detection processing of a peak.

Figure 7:
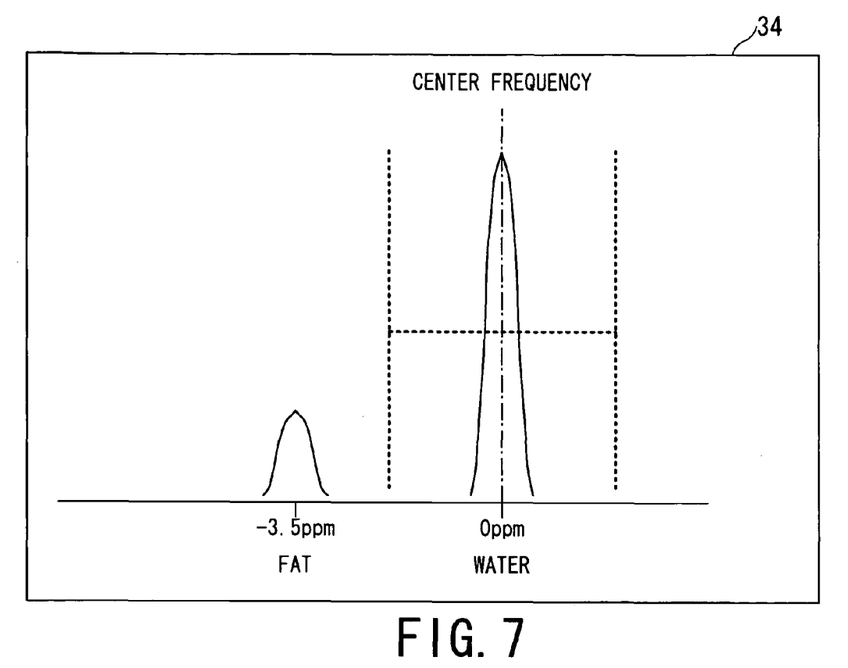
FIG. 7 is a diagram showing an example of screen displayed on the display unit in case of adjusting a center frequency of a water selective excitation pulse based on a frequency spectrum of which a peak of water signals is obtained satisfactorily.

FIG. 7 is a diagram showing an example of screen displayed on the display unit 34 in case of adjusting a center frequency of a water selective excitation pulse based on a frequency spectrum of which a peak of water signals is obtained satisfactorily.

As shown in FIG. 7, a resonant frequency of a fat has −3.5 ppm chemical shift from a resonant frequency of water. Therefore, if a center frequency of a water selective excitation pulse is set so as to match with a resonant frequency of water signals and it can be confirmed that no fat signal is in the band of the water selective excitation pulse, satisfactory water selective excitation can be performed. The case of silicone selective excitation is also similar.

Figure 8:
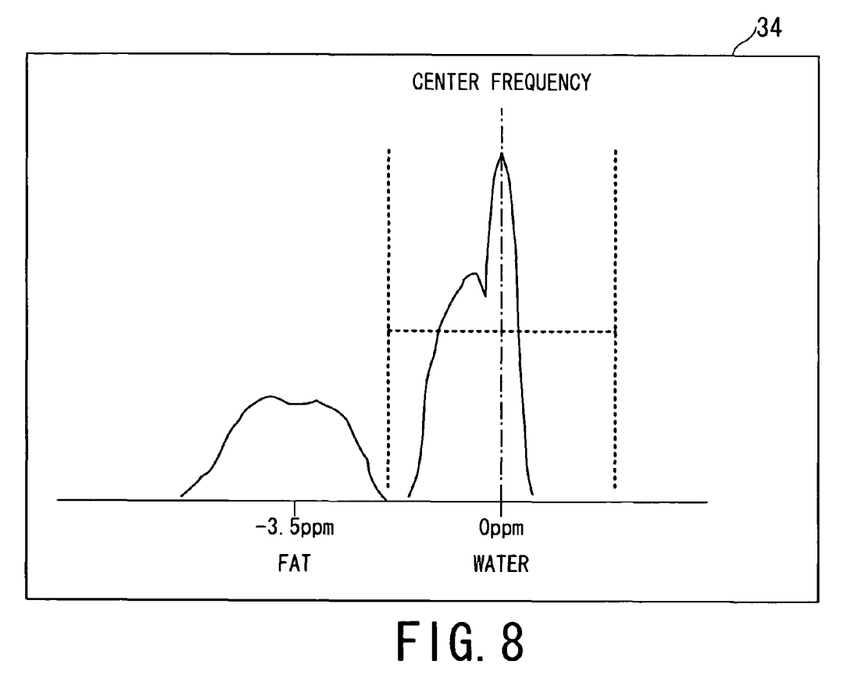
FIG. 8 is a diagram showing an example of screen displayed on the display unit in case of adjusting a center frequency of a water selective excitation pulse based on a frequency spectrum of which bands of water signals and fat signals spread.

FIG. 8 is a diagram showing an example of screen displayed on the display unit 34 in case of adjusting a center frequency of a water selective excitation pulse based on a frequency spectrum of which bands of water signals and fat signals spread.

As shown in FIG. 8, even if the bands of water signals and fat signals are expanded, satisfactory water selective excitation can be performed when it can be confirmed that the no fat signal is in the band of water selective excitation pulse. On the condition that fat signals are in the band of the water selective excitation pulse, the center frequency of the water selective excitation pulse can be easily changed to an appropriate value so that the fat signals become out of the band of the water selective excitation pulse.

Figure 9:
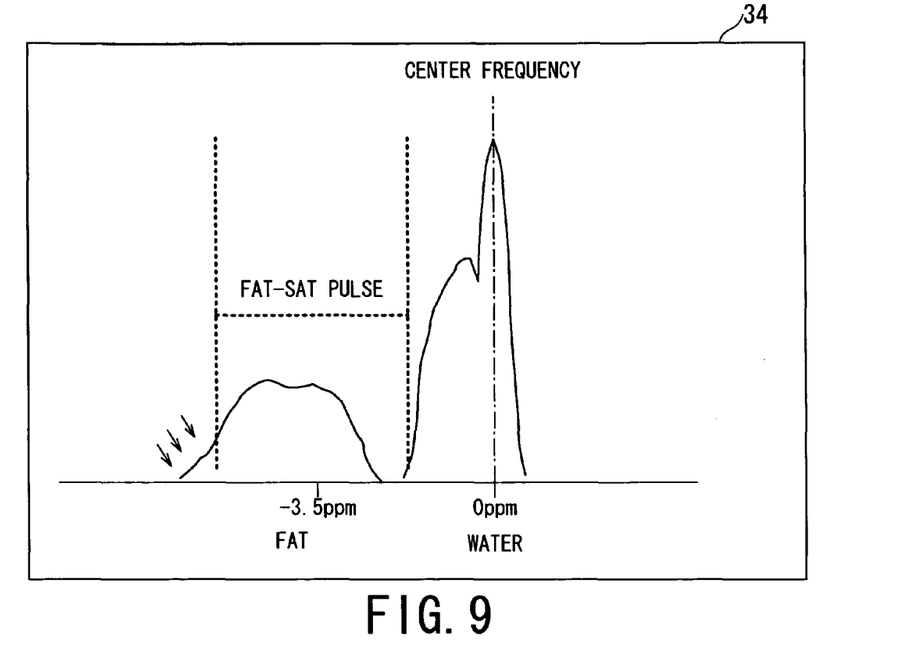
FIG. 9 is a diagram showing an example of screen displayed on the display unit in case of adjusting a center frequency of a fat saturation pulse based on a frequency spectrum of which bands of water signals and fat signals spread.
Figure 10:
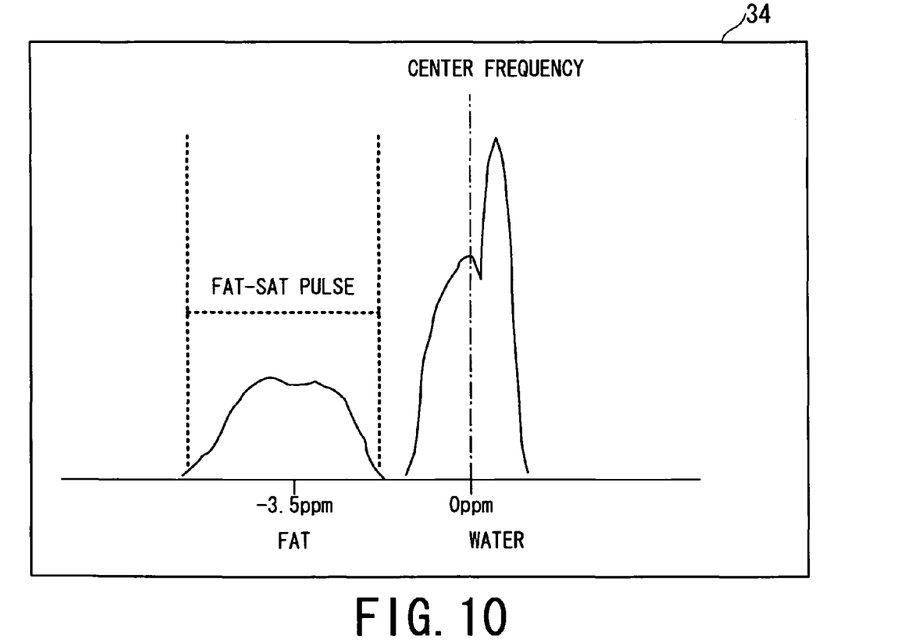
FIG. 10 is a diagram showing an example of adjusting the center frequency of the fat saturation pulse shown in FIG. 9 according to a spread of the fat signals.

FIG. 9 is a diagram showing an example of screen displayed on the display unit 34 in case of adjusting a center frequency of a fat saturation pulse based on a frequency spectrum of which bands of water signals and fat signals spread. FIG. 10 is a diagram showing an example of adjusting the center frequency of the fat saturation pulse shown in FIG. 9 according to a spread of the fat signals.

As shown in FIG. 9, in the case that the bands of water signals and fat signals are expanded, when a center frequency of a fat saturation pulse is set to a frequency shifted by −3.5 ppm from a frequency corresponding to a maximum peak of the water signals, there is a possibility of the fat signals existing outside of the frequency band of the fat saturation pulse as well. Therefore, as shown in FIG. 10, if the center frequency of the fat saturation pulse is shifted so that the band of the fat signals becomes within range of a FMHW of the fat saturation pulse, the fat saturation can be improved.

Figure 11:
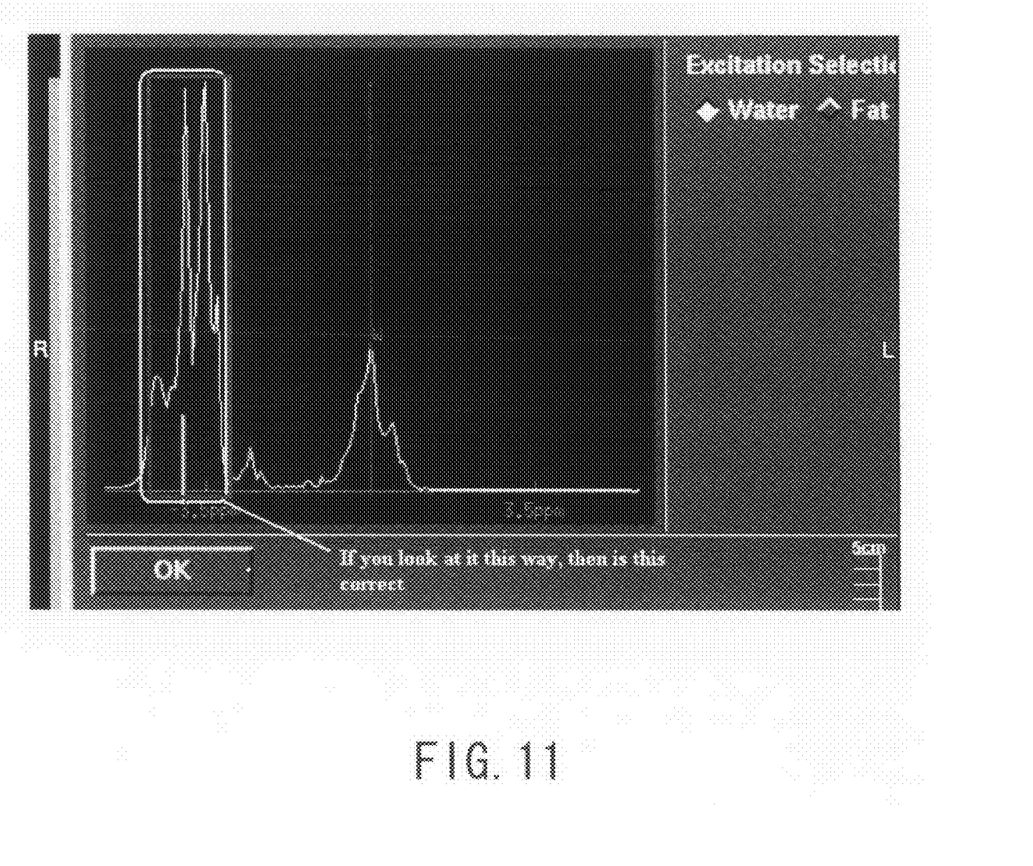
FIG. 11 is a diagram showing an example of practical setting screen in case of adjusting a center frequency of a fat saturation pulse according to a shape of a frequency spectrum with referring to a bandwidth of the fat saturation pulse.

FIG. 11 is a diagram showing an example of practical setting screen in case of adjusting a center frequency of a fat saturation pulse according to a shape of a frequency spectrum with referring to a bandwidth of the fat saturation pulse.

As shown in FIG. 11, check boxes for selecting water selective excitation or fat saturation are displayed on a setting screen, and for example, fat saturation is selected. Then, a center frequency of a fat saturation pulse can be adjusted to an appropriate value by moving a frame, showing a frequency bandwidth of the fat saturation pulse and displayed near fat signals on a frequency spectrum, depending on a spectrum form of the fat signals through the operation of the input device 33.

A frequency spectrum acquisition unit 39F, a frequency bandwidth display unit 39G and a center frequency adjusting unit 39H are included in the imaging condition setting unit 39 for having a setting support function of a center frequency of a pre-pulse based on a frequency spectrum as described above.

The frequency spectrum acquisition unit 39F has a function to obtain a frequency spectrum based on data such as k-space data obtained from the object P. The frequency bandwidth display unit 39G has a function to display a frequency bandwidth of a pre-pulse such as a fat saturation pulse on the display unit 34. The center frequency adjusting unit 39H has a function to adjust a center frequency of a pre-pulse according to shift instructing information from the input device 33.

Then, other functions of the computer 32 will be described.

The sequence controller control unit 40 has a function for controlling the driving of the sequence controller 31 by giving imaging conditions including a pulse sequence to the sequence controller 31 based on information from the input device 33 or another element. Further, the sequence controller control unit 40 has a function for receiving raw data from the sequence controller 31 and arranging the raw data to k space (Fourier space) formed in the k-space database 41.

Therefore, the k-space database 41 stores the raw data generated by the receiver 30 as k space data.

The image reconstruction unit 42 has a function for generating image data from k-space data by capturing the k-space data from the k-space database 41 and performing image reconstruction processing such as Fourier transform processing to the k-space data, and writing the generated image data to the image database 43.

Therefore, the image database 43 stores the image data generated by image reconstruction unit 42, i.e. acquired by a scan.

The image processing unit 44 has a function for performing desired image processing to image data read form the image database 43 and displaying the image data on the display unit 34.

Then, the operation and action of a magnetic resonance imaging apparatus 20 will be described.

Figure 12:
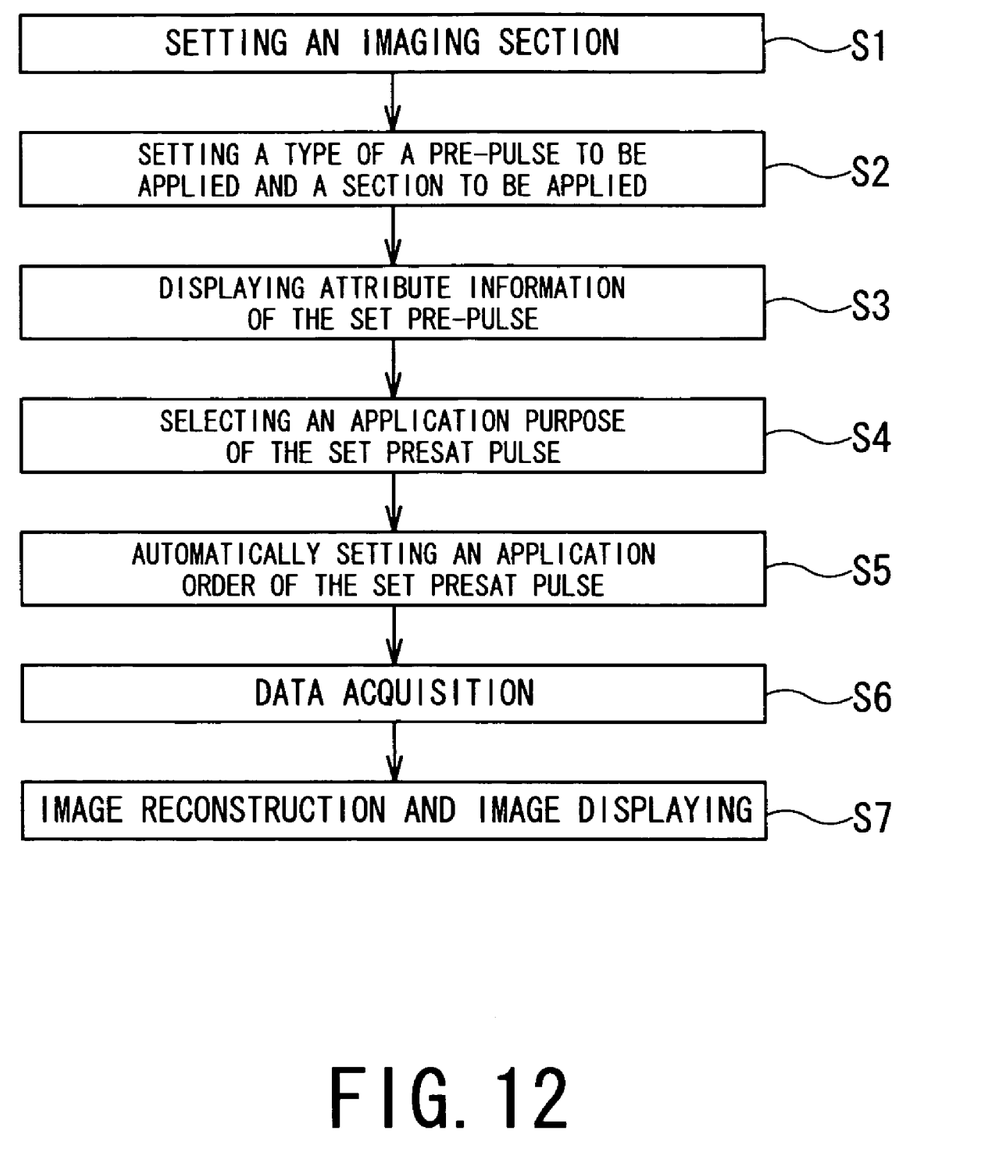
FIG. 12 is a flowchart showing an example of flow for setting an imaging condition with applying plural pre-pulses and acquiring an image of an object according to the set imaging condition by the magnetic resonance imaging apparatus shown in FIG. 2.

FIG. 12 is a flowchart showing an example of flow for setting an imaging condition with applying plural pre-pulses and acquiring an image of an object P according to the set imaging condition by the magnetic resonance imaging apparatus 20 shown in FIG. 2. The symbols including S with a number in FIG. 12 indicate each step of the flowchart.

First, in step S1, an imaging section is set as an imaging condition. That is, the imaging condition setting unit 39 displays a LOCATOR IMAGE for setting an imaging section on the display unit 34. Then, when an operator provides information for setting an imaging section to the imaging condition setting unit 39 by the operation of the input device 33 with referring to the LOCATOR IMAGE, an imaging section is set and a region is displayed by a frame. Then, letters such as "IMAGING PLANE" indicating the imaging section are displayed in the same color as that of the frame, for example in yellow near the frame by the imaging condition setting unit 39.

Subsequently in step S2, a type of a pre-pulse to be applied and a section to be applied are set as an imaging condition by the imaging condition setting unit 39. That is, an operator sets the desired number of types of pre-pulses and sections to be applied by operating the input device 33 with referring to the LOCATOR IMAGE.

Then, in step S3, the set attribute information of pre-pulses by the pre-pulse attribute information display unit 39A is displayed on the display unit 34. That is, regions on sections to be applied of which number is same as that of the set pre-pulses are displayed by frames respectively. Then, the attribute information of a corresponding pre-pulse, for example, a name of the corresponding pre-pulse is displayed near each frame so that a section to be applied by the corresponding pre-pulse becomes visible. Each name of pre-pulses and corresponding frame showing a section to be applied by the corresponding pre-pulse are displayed in a same color so that it is visible that they correspond to each other. On the other hand, the respective names of the pre-pulses and the respective frames showing sections to be applied by the pre-pulses are displayed in different colors between different pre-pulses, as needed.

Subsequently, in step S4, when a presat pulse is set, an application purpose of the presat pulse is selected by operating the input device 33. The selected application purpose is provided to the pre-pulse application order determining unit 39B and the pre-pulse attribute information display unit 39A. For example, when two presat pulses are set, the application purpose of one presat pulse can be set to suppression of vein signals and the application purpose of the other presat pulse can be set to suppression of influence due to intestinal motion. Each set application purpose of the presat pulses is displayed on a desired position on the display unit 34 by the pre-pulse attribute information display unit 39A.

Then, in step S5, an application order of the presat pulses is set automatically according to the respective set application purposes of the presat pulses by the pre-pulse application order determining unit 39B. For example, the application order of the presat pulse for suppression of vein signals is set to just before a 90-degree excitation pulse for data acquisition and the application order of the presat pulse for suppression of influence due to intestinal motion is set to before application of the presat pulse for suppression of the vein signals.

Note that, other imaging conditions such as a type of a pulse sequence for data acquisition are set at an arbitrary timing. Further, the setting order of imaging conditions described above may be altered.

Furthermore, when a suppression pulse and/or a selective excitation pulse using a chemical shift are included in pre-pulses, center frequencies of the suppression pulse and/or the selective excitation pulse are adjusted based on a frequency spectrum at an arbitrary timing before imaging. Specifically, for example, the frequency spectrum acquisition unit 39F reads the k-space data acquired from the object P by a scan for acquiring a frequency spectrum in advance from the k-space database 41 to obtain a frequency spectrum. Then, the frequency bandwidth display unit 39G displays frequency bandwidths of the suppression pulse and/or the selective excitation pulse on the display unit 34. Then, the center frequency adjusting unit 39H adjusts the center frequencies of the suppression pulse and/or the selective excitation pulse manually through the operation of the input device 33 by an operator or automatically.

Subsequently, in step S6, data acquisition is performed according to the set imaging condition. That is, when an operator instructs the data acquisition by the input device 34, the imaging condition setting unit 39 provides the imaging condition including a pulse sequence to the sequence controller 31 through the sequence controller control unit 40.

Then, the sequence controller 31 drives the gradient power supply 27, the transmitter 29, and the receiver 30 in accordance with the pulse sequence, thereby generating an X-axis gradient magnetic field Gx, a Y-axis gradient magnetic field Gy, a Z-axis gradient magnetic field Gz and RF signals corresponding to RF pulses including plural pre-pulses and 90 degree excitation pulse. Consequently, the RF coil 24 receives NMR signals generated due to nuclear magnetic resonance in the object P. Then, the NMR signals are provided to the receiver 30.

Note that, unnecessary signals in a specific region set as an imaging condition, for example, vein signals or signals with motion from an intestine are suppressed by the presat pulse. When the pre-pulse for tagging is applied as an imaging condition, specific spins, e.g., spins included in blood flow flowing into an imaging section are tagged.

The receiver 30 receives the NMR signals from the RF coil 24 and generates raw data which is digital data representing NMR signals by performing necessary signal processing to the NMR signals and subsequently A/D conversion. The receiver 30 supplies the generated raw data to the sequence controller 31. The sequence controller 31 supplies the raw data to the sequence controller control unit 40. The sequence controller control unit 40 arranges the raw data as k-space data in the k space formed in the k-space database 41. The data acquisition described above is performed under ECG synchronous based on an ECG signal acquired by the ECG unit 38 as needed.

Subsequently, in step S7, image data is reconstructed from the acquired data and the reconstructed image data is displayed. That is, the image reconstruction unit 42 reads the k-space data from the k-space database 41 and performs image reconstruction processing including Fourier transform processing to the read k-space data, thereby generating image data. The generated image data is written in the image database 43. Then, the image processing unit 44 performs desired image processing to the image data read from the image database 43 and displays the processed image data on the display unit 34.

Consequently, an image having an improved contrast by applying various pre-pulses for controlling the contrast is displayed on the display unit 34. For example, an image, on the imaging section, in which vein signals and the signals with the motion from an intestine are suppressed with enhancing a tagged blood flow is displayed on the display unit 34.

That is, the magnetic resonance imaging apparatus 20 mentioned above is an apparatus which improves operability of an operator by displaying attribute information such as a type, a name and an application range of a pre-pulse set as imaging conditions on a screen for setting a pre-pulse. Specifically, an operator can set a pre-pulse easily by color-displaying a frame showing an application range together with attribute information such as a name of a pre-pulse in a different color with regard to every pre-pulse.

Therefore, data acquisition can be performed with reducing operator's burden by the magnetic resonance imaging apparatus 20. Specifically, when an imaging condition with both applications of a t-SLIP and a presat pulse is set, it can be favorable to reduce operator's operation error.

Further in the magnetic resonance imaging apparatus 20, as well as an application order of pre-pulses can be displayed in time series so as to be seen easily, application purposes and effects of pre-pulses can be selected and displayed. In addition, an application order of pre-pulses can be also set automatically so that an application purpose and effect of a pre-pulse can be maximally obtained.

Therefore, for example, when plural presat pulses are applied, it is possible to set an application order of the presat pulses easily and appropriately. For example, the application order of the presat pulse by which signal suppression effect is required most can be set automatically to just before a 90-degree excitation pulse. This allows reducing an artifact such as a flow artifact by improving the effect due to a presat pulse.

Furthermore, since frequency bands of a fat suppression pulse and/or a water selective excitation pulse can be displayed on the display unit 34 so as to be visible by the magnetic resonance imaging apparatus 20, the values of center frequencies of the fat saturation pulse and/or the water selective excitation pulse can be adjusted to appropriate values easily. This allows improving suppression effect or selective excitation effect such as fat saturation or water selective excitation.

What is claimed is:

1. A magnetic resonance imaging apparatus comprising:
   an imaging condition setting unit including an input part for inputting an imaging condition applying plural pre-pulses which are applied prior to an application of an excitation pulse for acquisition of a nuclear magnetic resonance signal, the input part including a display part configured to display an application region and attribute information of at least one pre-pulse of the plural pre-pulses together with an imaging position; and
   an image acquisition unit configured to perform imaging data acquisition according to the input imaging condition and to generate an image based on data acquired by the data acquisition.

2. A magnetic resonance imaging apparatus as in claim 1, wherein said imaging condition setting unit is configured to display a name or type of an inputted pre-pulse as the attribute information on the display part.

3. A magnetic resonance imaging apparatus as in claim 1, wherein said imaging condition setting unit is configured to display an application purpose or application effect of an inputted pre-pulse as the attribute information on the display part.

4. A magnetic resonance imaging apparatus as in claim 1, wherein said imaging condition setting unit is configured to display an application order of inputted pre-pulses as the attribute information on the display part.

5. A magnetic resonance imaging apparatus as in claim 1, wherein said imaging condition setting unit is configured to display at least one of the attribute information and the application region with a different display form for every inputted pre-pulse or depending on attribution information of an inputted pre-pulse on the display part.

6. A magnetic resonance imaging apparatus as in claim 1, wherein said imaging condition setting unit is configured to display at least one of the attribute information and the application region with mutually different colors or line types for every inputted pre-pulse or depending on attribution information of an inputted pre-pulse on the display part.

7. A magnetic resonance imaging apparatus as in claim 1, wherein said imaging condition setting unit is configured to display the application region and the attribute information on the display part together with a scout image or a reference image.

8. A magnetic resonance imaging apparatus as in claim 1, wherein the pre-pulse is either of a water selective excitation pulse for selectively exciting water, a fat saturation pulse for suppressing fat, a saturation pulse applied precedently to applying a dephasing gradient magnetic field for suppressing signals from a desired matter by saturating spins of the desired matter, a spin labeling pulse for tagging a moving object flowing into an imaging section, a MTC pulse for suppressing signals from a parenchymatous organ by saturating a magnetization of protons in absorbed water and a SORS which is a MTC pulse applied with a slice selection gradient magnetic field.

9. A magnetic resonance imaging apparatus as in claim 1, wherein said imaging condition setting unit is configured to display an application region of a saturation pulse on the display part with using plural line types for indicating a slice direction when the pre-pulse is the saturation pulse.

10. A magnetic resonance imaging apparatus as in claim 1, wherein said imaging condition setting unit is configured to display a parameter for determining a pre-pulse having been used for acquiring an image having been acquired in a past on the display part.

11. A magnetic resonance imaging apparatus as in claim 1, wherein said imaging condition setting unit is configured to display a position tagged by a spin labeling pulse having been used for acquiring an image having been acquired in a past on the display part.

12. A magnetic resonance imaging apparatus comprising:
a frequency spectrum acquisition unit configured to acquire a frequency spectrum of magnetic resonance signals from an object;
an imaging condition setting unit including an input part for inputting an imaging condition with a pre-pulse and a display part configured to display information representing a center frequency of signals from a desired matter and a band of the pre-pulse together with the frequency spectrum; and
an image acquisition unit configured to perform imaging according to the imaging condition and generate an image based on data acquired by the imaging.

13. A magnetic resonance imaging apparatus of claim 12, wherein said imaging condition setting unit is configured to display information representing a center frequency of water signals or fat signals and a band of a water excitation pulse on the display part when the pre-pulse is the water excitation pulse.

14. A magnetic resonance imaging apparatus of claim 12, wherein said imaging condition setting unit is configured to display information representing a center frequency of water signals and a band of a fat saturation pulse on the display part when the pre-pulse is the fat saturation pulse.

15. A magnetic resonance imaging apparatus of claim 12, wherein said imaging condition setting unit is configured to display a full width at half max of application intensity of the pre-pulse in a frequency direction on the display part.

16. A magnetic resonance imaging apparatus of claim 12, wherein said imaging condition setting unit is configured to update both of the information representing the center frequency of the signals from the desired matter and the band of the pre-pulse to be displayed on the display part according to information for shifting either of the information representing the center frequency of the signals from the desired matter and the band of the pre-pulse when the information for the shifting is inputted from the input part.

17. A magnetic resonance imaging apparatus comprising:
an imaging condition setting unit configured to set an imaging condition for applying plural pre-pulses which are applied prior to an application of an excitation pulse for acquisition of a nuclear magnetic resonance signal and include an input part for inputting at least one of application regions and attribute information of the plural pre-pulses, a display part configured to display at least one of the application regions and the attribute information of the plural pre-pulses, and a determining part configured to determine an application order of the plural pre-pulses based on the attribute information inputted with the input part; and
an image acquisition unit configured to perform imaging according to the imaging condition and generate an image based on data acquired by the imaging.

18. A magnetic resonance imaging apparatus as in claim 17, wherein said determining part is configured to determine the application order so as to apply a desired pre-pulse within the plural pre-pulses just before an excitation pulse for the imaging.

19. A magnetic resonance imaging apparatus as in claim 17, wherein said display part is configured to display at least one of application purposes and application effects of the plural pre-pulses as the attribute information.

20. A magnetic resonance imaging apparatus as in claim 17, wherein said determining part is configured to set an application order of a pre-pulse of which application purpose is suppression of vein signals so as to be just before an excitation pulse for the imaging.

21. A magnetic resonance imaging apparatus for generating a MRI image based on an echo signal with regard to spins included in an imaging region on an object, said apparatus comprising:
- an imaging condition setting unit for setting an imaging condition for tagging blood flowing into the imaging region;
- an imaging unit configured to apply an inversion pulse for exciting the imaging region selectively, a tagging pulse for inverting spins included in a tagged region of the imaging region following the inversion pulse and a saturation pulse for saturating spins of blood flowing into a part region in the imaging region according to the imaging condition to acquire the echo signal after a constant period from applying the tagging pulse, the tagging pulse and the saturation pulse being applied prior to an application of an excitation pulse for acquisition of a nuclear magnetic resonance signal;
- a generating unit configured to generate a blood vessel image of the imaging region based on the echo signal; and
- a display unit configured to display the imaging region, an application region of the tagging pulse and an application region of the saturation pulse together with at least one of a name of the application region of the tagging pulse, a name of the application region of the saturation pulse, an application purpose of the tagging pulse, an application purpose of the saturation pulse, an application order of the tagging pulse and an application order of the saturation pulse to assist setting the imaging condition.

22. A magnetic resonance imaging method comprising use of at lest one computer in an MRI system to effect:
- inputting, with an input device, an imaging condition for applying plural pre-pulses which are applied prior to an application of an excitation pulse for acquisition of a nuclear magnetic resonance signal;
- displaying, with a display unit, an application region and attribute information of at least one pre-pulse of the plural pre-pulses together with an imaging position; and
- performing, with at least one computer, imaging according to the imaging data acquisition condition and generating an image based on data acquired by the imaging data acquisition.

* * * * *